(12) United States Patent
Maeda et al.

(10) Patent No.: US 10,298,426 B2
(45) Date of Patent: May 21, 2019

(54) COMMUNICATION CABLE MODULE AND TRANSMISSION LOSS COMPENSATION CIRCUIT

(71) Applicant: HITACHI METALS, LTD., Tokyo (JP)

(72) Inventors: Koji Maeda, Tokyo (JP); Izumi Fukasaku, Tokyo (JP); Masaru Kokubo, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 15/815,224

(22) Filed: Nov. 16, 2017

(65) Prior Publication Data

US 2018/0167242 A1 Jun. 14, 2018

(30) Foreign Application Priority Data

Dec. 9, 2016 (JP) ................. 2016-239398

(51) Int. Cl.
*H04L 27/04* (2006.01)
*H03F 1/00* (2006.01)
*H04L 25/02* (2006.01)
*H04L 25/03* (2006.01)

(52) U.S. Cl.
CPC ............. *H04L 27/04* (2013.01); *H03F 1/00* (2013.01); *H04L 25/02* (2013.01); *H04L 25/03* (2013.01); *H03F 2200/153* (2013.01)

(58) Field of Classification Search
CPC ......... H04L 27/04; H04L 25/02; H04L 25/03; H03F 1/00; H03F 2200/153
See application file for complete search history.

(56) References Cited

U.S. PATENT DOCUMENTS

| 5,559,423 | A | * | 9/1996 | Harman | G05F 1/565 323/277 |
| 6,664,912 | B1 | * | 12/2003 | Zanchi | H03F 3/45183 341/161 |
| 7,391,257 | B1 | * | 6/2008 | Denison | A61B 5/0002 330/10 |
| 9,413,566 | B2 | * | 8/2016 | Mori | H04L 25/0292 |
| 2007/0152753 | A1 | * | 7/2007 | Swanson | H03F 1/12 330/261 |
| 2008/0048778 | A1 | * | 2/2008 | Lee | H03F 1/08 330/253 |

(Continued)

FOREIGN PATENT DOCUMENTS

| JP | 2004-048141 A | 2/2004 |
| JP | 2009-017455 A | 1/2009 |

(Continued)

*Primary Examiner* — Kenneth Lam
(74) *Attorney, Agent, or Firm* — Volpe and Koenig, P.C.

(57) ABSTRACT

There is disclosed a communication cable module including: a conductive cable; a linear amplifier connected to the conductive cable; a detector for detecting presence or absence of an input signal of the conductive cable; a first circuit having a variable-current function; and a second circuit having a common-mode voltage regulating function, wherein when the input signal is not present, the variable-current function of the first circuit reduces an output current of the linear amplifier and the common-mode voltage regulating function of the second circuit regulates an output common-mode voltage of the linear amplifier.

15 Claims, 7 Drawing Sheets

(56) References Cited

U.S. PATENT DOCUMENTS

| | | | |
|---|---|---|---|
| 2009/0017776 A1 | 1/2009 | Oshima et al. | |
| 2009/0052559 A1* | 2/2009 | Iwasaki | H04L 25/029 375/257 |
| 2010/0177829 A1* | 7/2010 | Suzuki | H01L 27/092 375/257 |
| 2010/0184397 A1 | 7/2010 | Kadous et al. | |
| 2010/0315121 A1* | 12/2010 | Atrash | H03K 19/0005 326/30 |
| 2013/0049724 A1* | 2/2013 | Kung | G05F 1/575 323/282 |
| 2014/0056388 A1* | 2/2014 | Mori | H04B 1/10 375/340 |

FOREIGN PATENT DOCUMENTS

| | | |
|---|---|---|
| JP | 2009-049672 A | 3/2009 |
| JP | 2013-038788 A | 2/2013 |

\* cited by examiner

COMMUNICATION CABLE MODULE AND TRANSMISSION LOSS COMPENSATION CIRCUIT

BACKGROUND OF THE INVENTION

1. Field of the Invention

The present invention relates to communication cable modules, and particularly relates to a cable module having a small fluctuation in output common-mode voltage and output impedance between operation time and idle time.

2. Description of the Related Art

JP-2009-49672-A discloses a technique for reducing a current at the idle time by connecting a switch between a load resistor and a power source (GND) and switching on/off at the operation time and idle time.

SUMMARY OF THE INVENTION

For example, when an electric transmission cable module (also referred to as a direct attach cable (DAC)) is used for intra-rack or inter-rack communication in a data center, the transmission distance becomes short when the transmission speed increases because the transmission loss in the radio frequency band increases. Accordingly, in recent years, an active copper cable (ACC) module capable of long-distance transmission has been developed and manufactured by mounting a continuous time linear equalizer integrated circuit (CTLE IC) for transmission loss compensation in an electric cable module. The ACC module is desired to be shifted to the idle state when the signal is not input so as to reduce the power consumption and not to output an unnecessary wave that causes a host IC in a device connected thereto to operate erroneously.

In the above-described JP-2009-49672-A, there is shown a method of turning on/off the switch connected between the load resistor and the power source at the time of switching between the operation time and idle time. In general, the host ICs connected to the input and output terminals of the ACC are manufactured with a fine CMOS process that enables high-speed signal processing, and thus, has a low withstand voltage. On the other hand, the CTLE IC mounted in the ACC module is manufactured with a BiCMOS process that allows application of 3.3 V power supply that far exceeds the withstand voltage of a fine CMOS process, with emphasis on linearity and cost. Therefore, when a shift is made to the idle or normal operation according to the method of JP-2009-49672-A, since a large-amplitude common-mode pulse signal exceeding the operating range of the reception host IC is generated and the reception host IC cannot receive data correctly, as a result there is a problem that the communication speed decreases between the hosts. Further, if the amplitude level is further increased, the reception host IC will be destroyed in the worst case.

In addition, when the shift is made to the idle or the normal operation according to the method of JP-2009-49672-A, the output impedance changes greatly from the differential value 100 ohm to the open end level for example, and thus, in the case of a multi-pair transmission cable module which are formed by bundling a plurality of transmission cables, there is a problem that the cross talk between the transmission cables fluctuates greatly and the communication quality of other lanes deteriorates.

Therefore, in order to solve the above problem, an object of the present invention is to provide a communication cable module in which the output common-mode voltage and the output impedance change little between the normal operation time and the idle time.

According to an aspect of the present invention, a communication cable module includes: a conductive cable; a linear amplifier connected to the conductive cable; a detector for detecting presence or absence of an input signal of the conductive cable; a first circuit having a variable-current function; and a second circuit having a common-mode voltage regulating function, wherein when the input signal is not present, the variable-current function of the first circuit reduces an output current of the linear amplifier and the common-mode voltage regulating function of the second circuit regulates an output common-mode voltage of the linear amplifier.

According to another aspect of the present invention, a transmission loss compensation circuit that compensates a transmission loss of a conductive cable includes: a linear amplifier connected to the conductive cable; a detector for detecting a state of an input signal of the conductive cable; a first circuit having a function of varying a current of the linear amplifier; and a second circuit having a function of regulating a common-mode voltage of the linear amplifier, wherein the transmission loss compensation circuit changes an operation mode of the first circuit and the second circuit according to the state of the input signal detected by the detector.

According to the present invention, a communication cable module having a small variation in the output common-mode voltage and the output impedance between the normal operation time and idle time can be provided.

DESCRIPTION OF THE PREFERRED EMBODIMENTS

In the following description of the invention, parts having the same part or similar function are denoted by the same reference numeral in different drawings, and redundant descriptions may be omitted.

A typical example of the embodiment is outlined below. That is, the communication cable module of the present embodiment includes a cable made of copper wire or silver wire, for example, as a conductive cable, a linear amplifier for equalizing the cable loss, a detector for detecting the presence or absence of an input signal, a variable-current function, and a common-voltage regulating function, and when there is no input signal, the variable-current function reduces the current in the linear amplifier and the common-voltage regulating function makes the linear-amplifier output common-mode voltage constant.

First Embodiment

Figure 1:
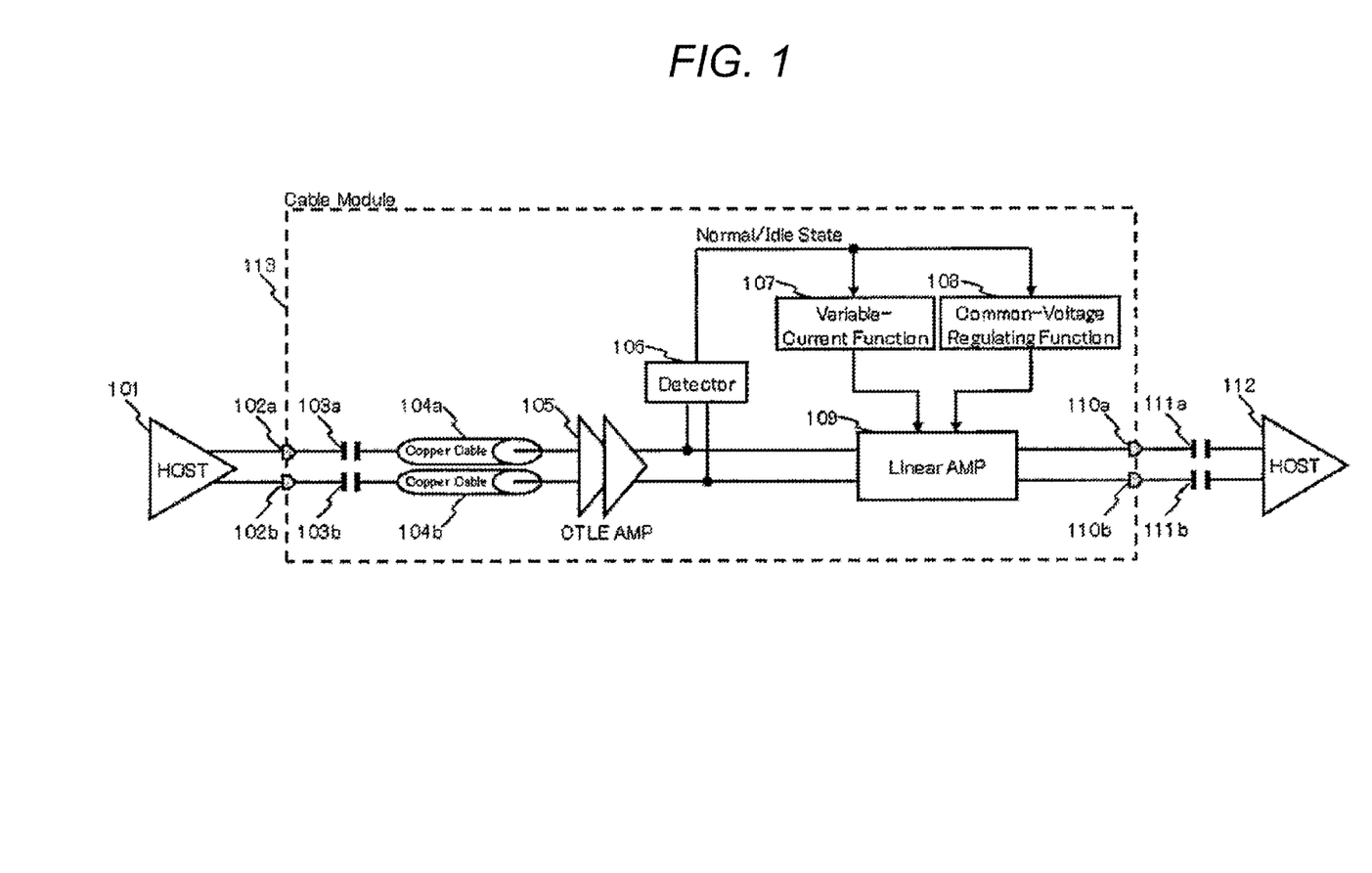
FIG. 1 is a configuration diagram for illustrating a first embodiment of a communication cable module according to the present invention.

A first embodiment of the present invention will be described with reference to FIG. 1. A communication cable module 113 shown in FIG. 1 is an ACC and includes input terminals 102a and 102b, AC coupling capacitors 103a and 103b, copper cables 104a and 104b, a CTLE amplifier 105, a detector 106, a variable-current function 107, a common-voltage regulating function 108, a linear amplifier 109, and output terminals 110a and 110b. The communication cable module 113 is inserted between a transmission host IC 101 and AC coupling capacitors 111a and 111b as well as a reception host IC 112, and is used as a communication cable module for mediating communication between the host ICs.

The differential signal transmitted from the transmission host IC 101 is input into the cable module from the input terminals 102a and 102b, and thereafter, the signal is input into the copper cables 104a and 104b via the AC coupling capacitors 103a and 103b for dividing the operating voltage of the transmission host IC 101 and the CTLE amplifier 105.

Impedance matching of the copper cables 104a and 104b with the transmission host IC 101 has been performed, and thus the loss due to reflection is sufficiently small. The amplitude of the radio-frequency component of the differential signal output from the copper cables 104a and 104b has been reduced due to the cable loss. The differential signal output from the copper cables 104a and 104b are then input into the CTLE amplifier 105.

The CTLE amplifier 105 is a CTLE amplifier with inverse characteristics of the cable loss, and by amplifying the amplitude of the radio-frequency component, the differential signal is subjected to waveform equalization to form a waveform close to the output of the transmission host IC 101. The differential signal output from the CTLE amplifier 105 is input into the linear amplifier 109 for the output buffer.

The linear amplifier 109 has undergone impedance matching with the reception host IC 112. The differential signal output from the linear amplifier 109 passes through the output terminals 110a and 110b, and then, is input into the reception host IC 112 via the AC coupling capacitors 111a and 111b for dividing the operating voltage of the linear amplifier 109 and the reception host IC 112. As described above, the communication cable module 113 enables the long distance transmission between the transmission host IC 101 and the reception host IC 112 by equalizing the cable loss of the copper cables 104a and 104b with the CTLE amplifier 105.

Here, when the transmission host IC 101 is not outputting a signal, the communication cable module 113 shifts to the idle mode. The purpose of shifting to the idle mode is to reduce the power consumption by decreasing the current of the linear amplifier 109 and to prevent unnecessary waves generated by, for example, plugging and unplugging the cable from being input into the reception host IC 112 to cause miscommunication between the hosts, by decreasing the AC gain of the linear amplifier 109. The following describes the operation when the communication cable module 113 shown in FIG. 1 shifts between the normal operation time and the idle time.

The output from the CTLE amplifier 105 is connected to the detector 106 separately from the linear amplifier 109, and the detector 106 monitors the output power of the CTLE amplifier 105 at all times. When determining that a signal is input into the communication cable module 113, the detector 106 outputs a signal for a normal operation to the variable-current function 107 and the common-voltage regulating function 108.

The variable-current function 107 and the common-voltage regulating function 108, to which a signal for normal operation has been input, supplies current and voltage to the linear amplifier 109 respectively so that the current value and the output common potential of the linear amplifier 109 are optimum for outputting signals to the reception host IC 112.

On the other hand, when the transmission host IC 101 is not outputting a signal, the detector 106 determines that no signal is input into the communication cable module 113, and output a signal for idle operation to the variable-current function 107 and the common-voltage regulating function 108. The variable-current function 107 into which the idle operation signal has been input, supplies the linear amplifier 109 with a current smaller than that during normal operation so that the power of the linear amplifier 109 is reduced to a level lower than during the normal operation.

When the current in the linear amplifier is greatly reduced, the output common-mode voltage will generally fluctuate greatly so as to generate a pulse signal as described above, which hinders communication between the transmission host IC 101 and the reception host IC 112, and further, when being high, the voltage of the pulse signal will destroy the reception host IC 112 whose withstand voltage is low. In order to prevent such a pulse signal from being generated, the voltage regulating function 108 supplies the appropriate voltage to the linear amplifier 109 in accordance with the current reduction of the linear amplifier 109 so that the output common-mode voltage approaches the voltage during normal operation, or the output common-mode voltage becomes equal to the voltage during the normal operation.

Although the CTLE amplifier 105 is shown as a two-stage configuration as an example, any number of stages may be used, and the detector 106 may be connected to the first stage output of the CTLE amplifier. Likewise, the linear amplifier 109 may also have a multi-stage amplifier configuration.

Hereinafter, specific circuit configuration examples of the variable-current function 107, common-voltage regulating function 108, and linear amplifier 109 will be described.

Second Embodiment

Figure 2:
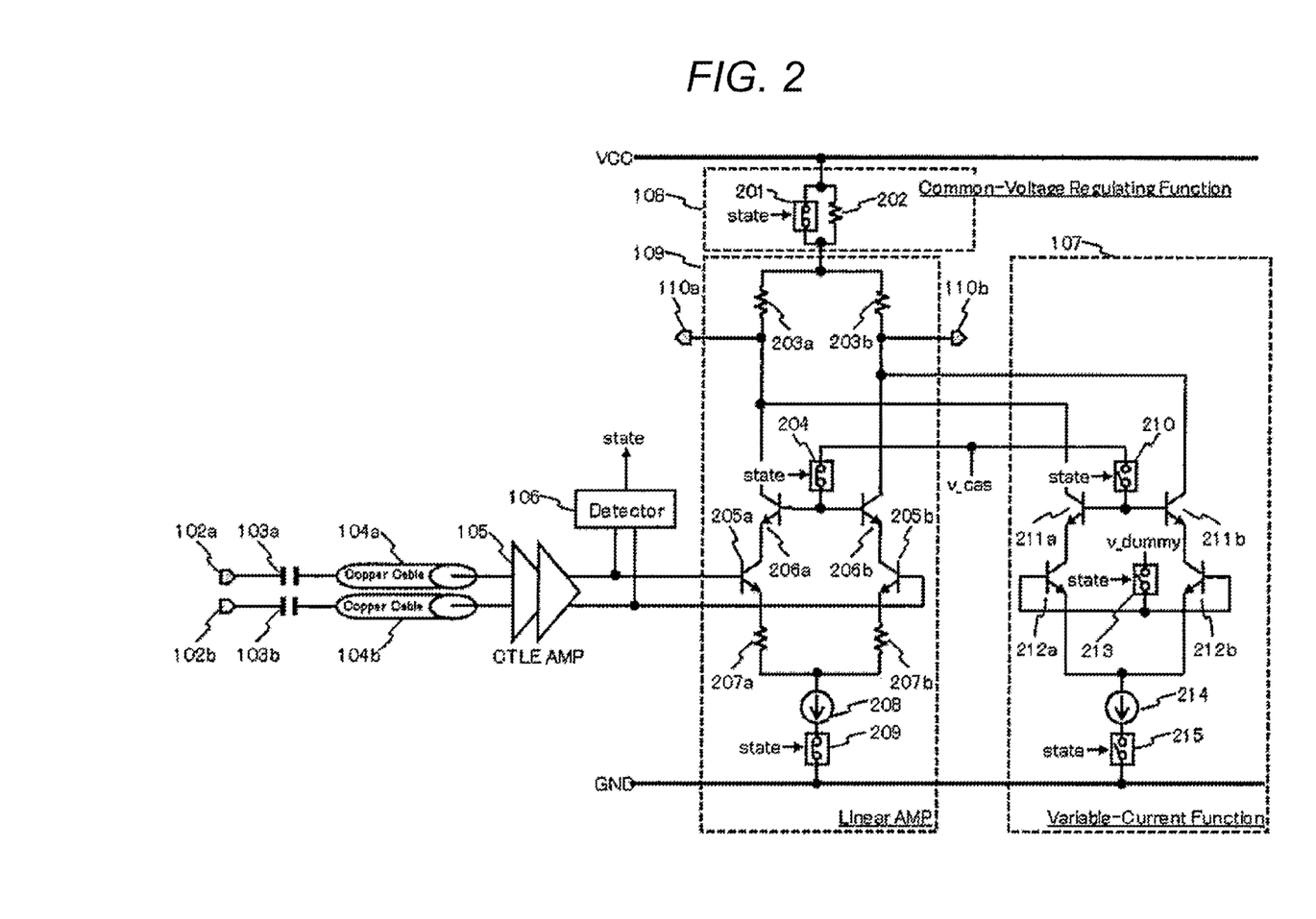
FIG. 2 is a configuration diagram for illustrating a second embodiment of the communication cable module according to the present invention.

The second embodiment of the present invention will be described with reference to FIG. 2. The communication cable module shown in FIG. 2 is an ACC, and includes the input terminals 102a and 102b, the AC coupling capacitors 103a and 103b, the copper cables 104a and 104b, the CTLE amplifier 105, the detector 106, the variable-current function 107, the common-voltage regulating function 108, the linear amplifier 109, and the output terminals 110a and 110b.

The linear amplifier 109 is a general differential cascode amplifier and includes resistors 203a, 203b, 207a and 207b, switches 204 and 209, amplifying transistors 205a and 205b, cascode transistors 206a and 206b, and a current source 208. The output of the CTLE amplifier 105 is input into the bases of the amplifying transistors 205a and 205b. The amplifying transistors 205a and 205b are connected to the resistors 207a and 207b for improving the linearity on the emitter side. The resistors 207a and 207b are connected to the current source 208 which supplies a current necessary for the linear operation of the linear amplifier 109. The current source 208 is grounded (GND) via the switch 209. The collector sides of the amplifying transistors 205a and 205b are connected to the cascode transistors 206a and 206b for improving the radio-frequency characteristics. The collector sides of the cascode transistors 206a and 206b are connected to the load resistors 203a and 203b for converting current into voltage and the output terminals 110a and 110b. An optimum constant voltage v_cas for operating the cascode transistors 206a and 206b is supplied to the bases of the cascode transistors 206a and 206b through the switch 204. The resistors 203a and 203b are connected to the common-voltage regulating function 108.

The common-voltage regulating function 108 is constituted by connecting a switch 201 and a resistor 202 in parallel. The switch 201 is composed of a large-size PMOS transistor, for example, and has much smaller on-resistance than the resistor 202. The switch 201 and the resistor 202 are connected in parallel, and the one side is connected to the linear amplifier 109 and the other side is connected to the power source (VCC).

The variable-current function 107 is a dummy circuit of the linear amplifier 109 and includes switches 210, 213 and 215, dummy amplifying transistors 212a and 212b, cascode transistors 211a and 211b, and a current source 214.

The dummy amplifying transistors 212a and 212b are connected to the current source 214 that supplies a very small current on the emitter side. The current source 214 is grounded (GND) via the switch 215. An optimum voltage value v_dummy for operating the variable-current function 107 is applied to the bases of the dummy amplifying transistors 212a and 212b through the switch 213. On the other hand, the cascode transistors 211a and 211b are connected to the collectors of the dummy amplifying transistors 212a and 212b and the collectors of the cascode transistors 211a and 211b are connected to the collectors of the cascode transistors 206a and 206b of the linear amplifier. The optimum constant voltage v_cas for operating the cascode transistors 211a and 211b is supplied to the bases of the cascode transistors 211a and 211b through the switch 210.

The basic operation from the time when the differential signal is input into the input terminals 102a and 102b until the signal is output from the output terminals 110a and 110b during communication is the same as in the first embodiment, and thus, the description is omitted. Here, the circuit operation during the normal operation and the idle operation will be described.

TABLE 1

| State | SW 201, 204, 209 | SW 210, 213, 215 |
|---|---|---|
| Normal | ON | OFF |
| Idle | OFF | ON |

Table 1 shows the state of the switch at the normal time and idle time. In the normal time, the switches 201, 204, and 209 are turned on, and the switches 210, 213, and 215 are turned off. Therefore, the variable-current function 107 does not operate and does not affect the radio-frequency characteristics at all. On the other hand, the linear amplifier 109 amplifies the signal input from the CTLE amplifier 105 and outputs the amplified signal to the output terminals 110a and 110b. At this time, in the common-voltage regulating function 108, the switch 201 with very small on-resistance is turned on, and a voltage substantially equal to the power supply voltage (VCC) is applied to the linear amplifier 109. Hence, the output common-mode voltage VCM_Normal at the normal time is expressed by equation (1) assuming that the current value of the current source 208 is I_Normal, the resistance value of the resistors 203a and 203b is Rload, and the on-resistance of the switch 201 is R_Normal.

$$\text{VCM\_Normal} = \text{VCC} - I\_\text{Normal} \times R\_\text{Normal} - I\_\text{Normal}/2 \times R\text{load} \quad (1)$$

On the other hand, at the idle time, the switches 201, 204 and 209 are turned off and the switches 210, 213 and 215 are turned on. As a result, the linear amplifier 109 does not operate, so that signals and noise entering the input terminals 102a and 102b are not output to the output terminals 110a and 110b. Instead, the variable-current function 107 having the current source 214 with a small current value operates as a constant current source circuit to reduce the power consumption of the communication cable module. At this time, since the switch 201 is turned off in the common-voltage regulating function 108, a current flows to the resistor 202, and the common-mode voltage is output to the output terminals 110a and 110b similarly to in the normal time. Accordingly, the output common-mode voltage VCM_Idle at the idle time is expressed by equation (2), assuming that the current value of the current source 214 is I_Idle and the resistance value of the resistor 202 is R_Idle.

$$\text{VCM\_Idle} = \text{VCC} - I\_\text{Idle} \times R\_\text{Idle} - I\_\text{Idle}/2 \times R\text{load} \quad (2)$$

Hence, by designing the current value (I_Idle) of the current source 214 and the resistance value (R_Idle) of the resistor 202 so that the output common-mode voltages VCM_Normal and VCM_Idle generated during normal operation and idle respectively become equal to each other, the common-mode output voltage can be kept constant between the normal operation and the idle.

In addition, since the output load resistors 203a and 203b of the linear amplifier are fixed at this time, the output impedance is not fluctuated. Therefore, even in the case of the multi-pair transmission cable module formed by bundling a plurality of transmission cables, there is no problem that the cross talk between the transmission cables is greatly fluctuated and the communication quality of other lanes is degraded.

The linear amplifier 109 is shown as an amplifier for an output buffer, but may have a CTLE amplifier configuration in which a capacitor is connected between the emitter outputs of the amplifying transistors 205a and 205b.

Figure 5:
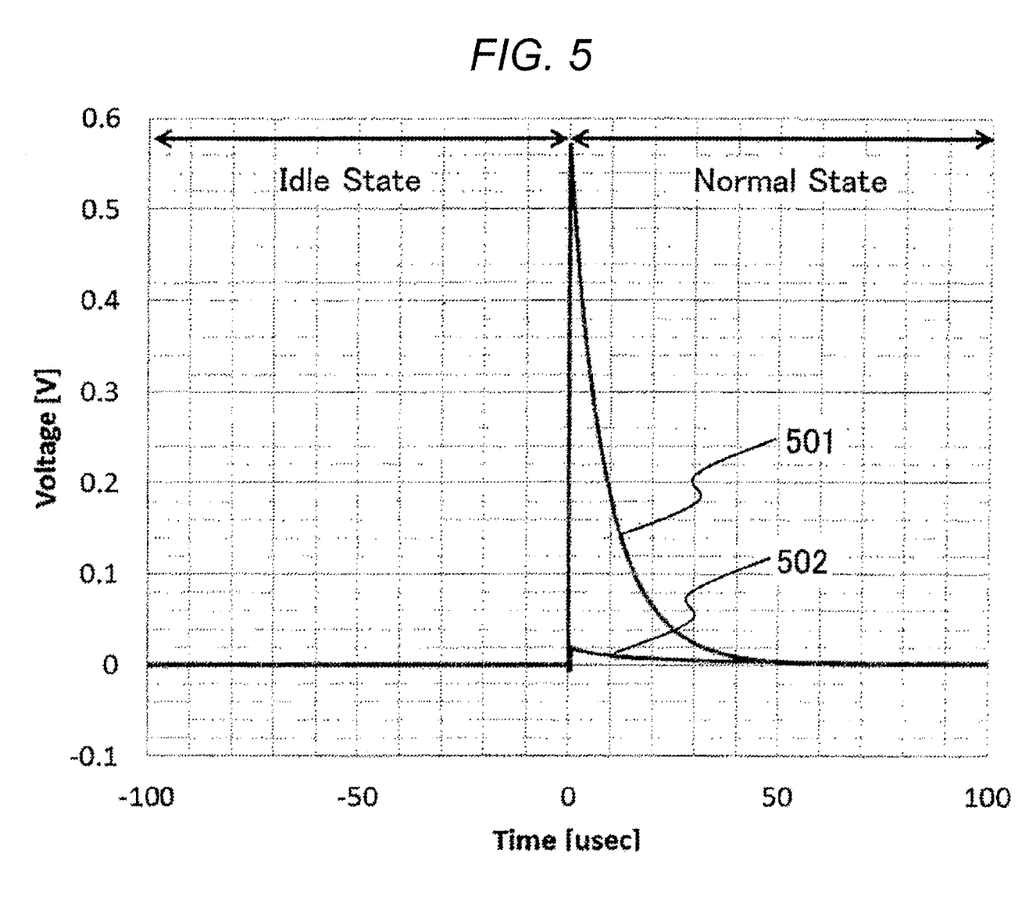
FIG. 5 is a diagram for illustrating an effect of the embodiment.

FIG. 5 shows the results of the circuit simulation performed to confirm the effect of the embodiment of the present invention. Time response waveforms 501 and 502 are time response waveforms output from the communication cable module 113 when the shift is made from the idle to the normal operation, and particularly, show the output waveforms of the AC coupling capacitors 111a and 111b. The horizontal axis is the time axis, and in the simulation, the change is made in 0 sec from idle to normal operation. On the other hand, the vertical axis indicates the common-mode voltage value.

Here, the time response waveform 501 shows the common-mode voltage at the time of simulation for a configuration in which a switch is provided between the power source and the load resistor and turned off at the idle time, as in the conventional example. At the moment of shifting from idle to normal operation, a very large step signal is generated and it took about 50 µsec to converge. As a result, there is a possibility that the above-mentioned communication obstruction or destruction of the reception host IC may be caused. On the other hand, the time response waveform 502 is a waveform when the present embodiment is applied, and since the common-mode voltage fluctuation at the time of the shift is very small, communication can be started without obstructing the communication.

Third Embodiment

Figure 3:
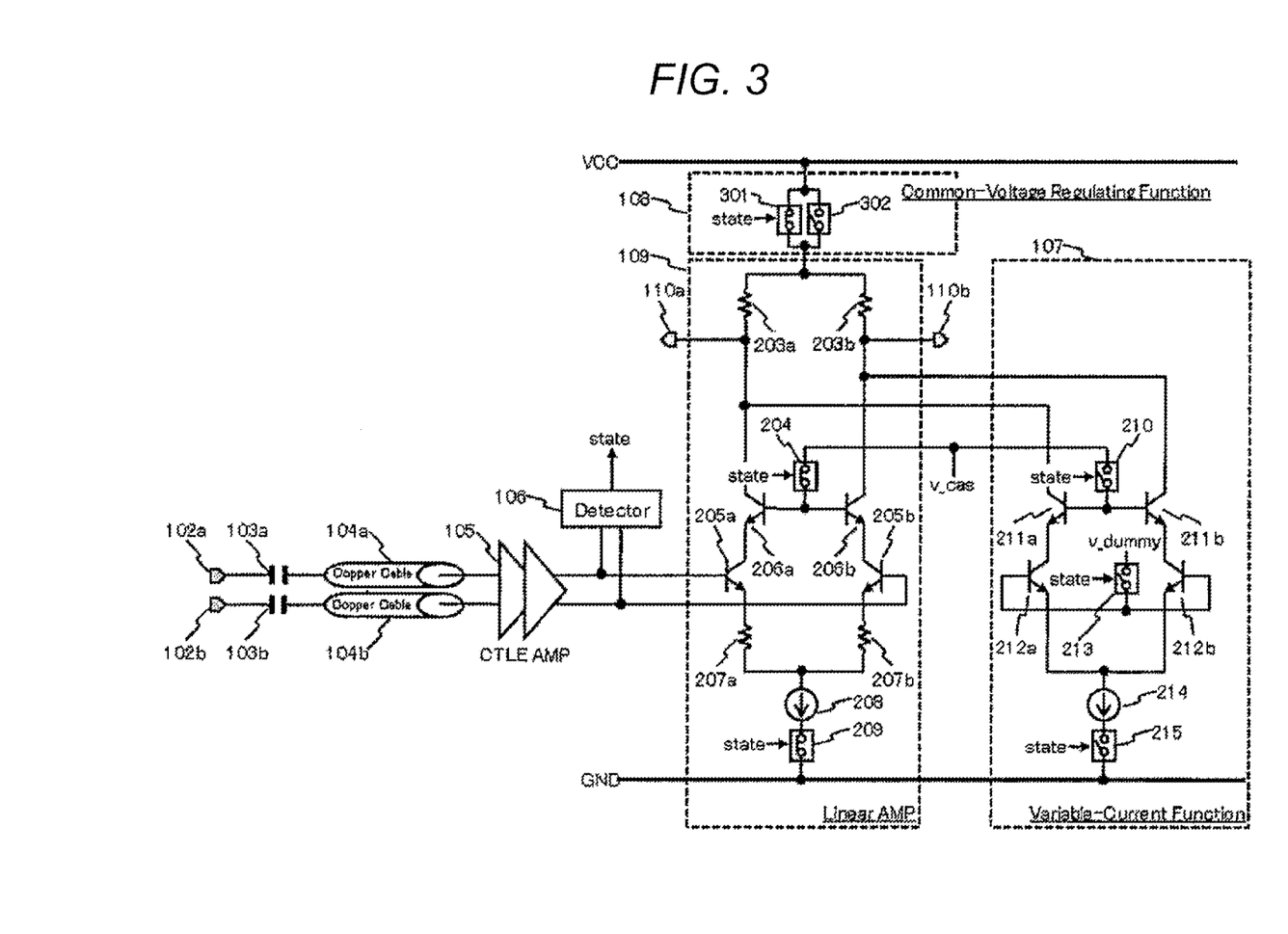
FIG. 3 is a configuration diagram for illustrating a third embodiment of the communication cable module according to the present invention.

A third embodiment of the present invention will be described with reference to FIG. 3. The communication cable module shown in FIG. 3 is an ACC and is the same as that of the second embodiment in FIG. 2 except for the configuration of the common-voltage regulating function 108.

The common-voltage regulating function 108 in the third embodiment is constituted by connecting switches 301 and 302 in parallel. The switch 301 is composed of, for example, a large-size PMOS transistor with a small on-resistance. On the other hand, the switch 302 is composed of a small-size PMOS transistor with a large on-resistance. Hence, if the resistor 202 of the second embodiment is assumed to be the switch 302, the circuits can be regarded as the same circuits. As for the control of each switch, the switches 301, 204, and 209 are turned on and the switches 302, 210, 213, and 215 are turned off at the normal time. The switches 301, 204, and 209 are turned off, and the switches 302, 210, 213, and 215 are turned on at the idle time. Description of the circuit operation is omitted.

According to the present embodiment, since the common-voltage regulating function 108 is constituted by the same element, the resistance against element variations is high as compared with the second embodiment.

Fourth Embodiment

Figure 4:
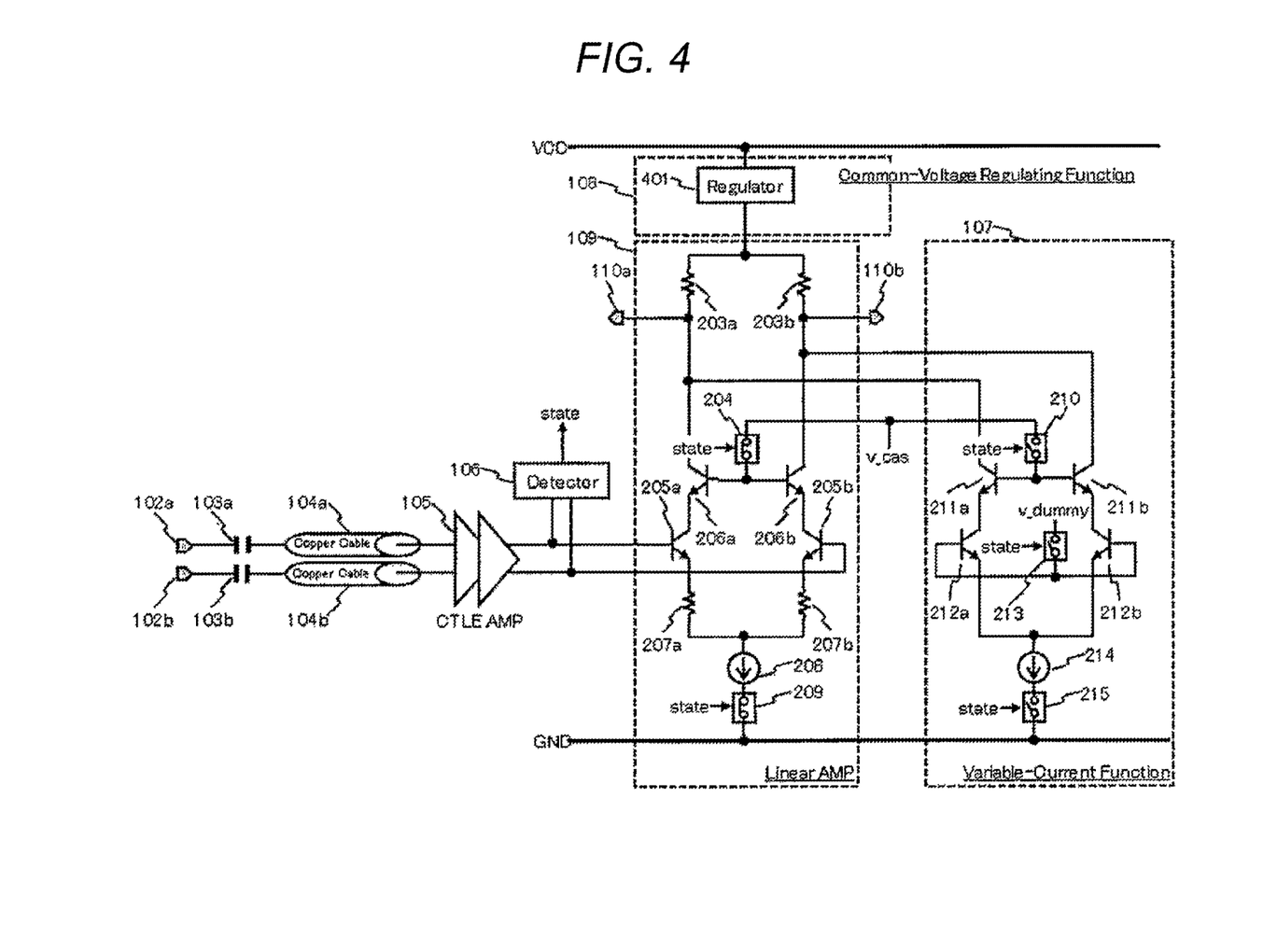
FIG. 4 is a configuration diagram for illustrating a fourth embodiment of the communication cable module according to the present invention.

A fourth embodiment of the present invention will be described with reference to FIG. 4. The communication cable module shown in FIG. 4 is an ACC, and is the same as in the second embodiment except for the configuration of the common-voltage regulating function 108.

The common-voltage regulating function 108 in the fourth embodiment is constituted by a regulator 401. Here, the regulator 401 is what is called a power supply circuit composed of a series regulator such as an operational amplifier, a switching regulator that performs a pulse width modulation (PWM) operation, or the like, having a function of varying the output voltage. Assuming that the output voltage of the regulator 401 during the normal operation, that is, the supply voltage to the linear amplifier 109 is VReg_Normal, the current value of the current source 208 is I_Normal, and the resistance of the resistors 203a and 203b is Rload, the output common-mode voltage VCM_Normal at the normal time is expressed by equation (3).

$$VCM\_Normal = VReg\_Normal - I\_Normal/2 \times Rload \quad (3)$$

On the other hand, assuming that the output voltage of the regulator 401 at the idle time is VReg_Idle and the current value of the current source 214 is I_Idle, the output common-mode voltage VCM_Idle at the idle time is expressed by equation (4).

$$VCM\_Idle = VReg\_Idle - I\_Idle/2 \times Rload \quad (4)$$

Therefore, by designing the output voltages VReg_Normal and VReg_Idle of the regulator 401 so that the output common-mode voltages VCM_Normal and VCM_Idle generated during normal operation and idle respectively become equal to each other, the output common-mode voltage remains constant between the normal operation and idle.

According to this embodiment, since the power supply circuit is used, improvement of power supply rejection ratio (PSRR: ratio of fluctuation removal of power supply voltage) can be expected with respect to the second embodiment. Further, when the linear amplifier 109 and the variable-current function 107 are designed to be capable of operating at a low voltage using a switching regulator, a reduction in power consumption can be expected.

Fifth Embodiment

Figure 6:
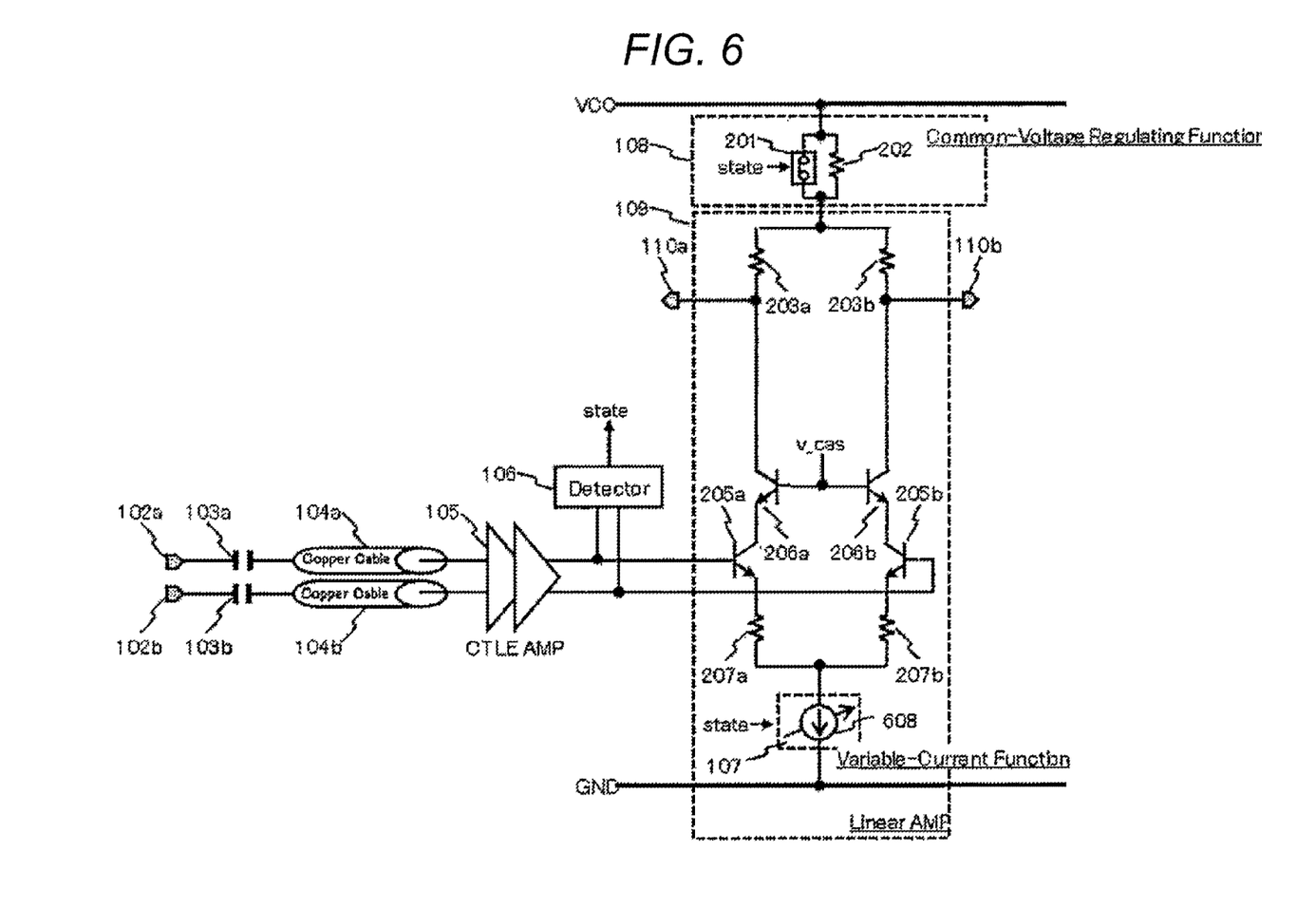
FIG. 6 is a configuration diagram for illustrating a fifth embodiment of the communication cable module according to the present invention.

A fifth embodiment of the present invention will be described with reference to FIG. 6. The communication cable module shown in FIG. 6 is an ACC, and the current source of the linear amplifier 109 is a variable current source 608, and assuming that the variable current source 608 is the variable-current function 107, the configuration is the same as that of the second embodiment in FIG. 2. The variable current source 608 operates to supply the current required for linear operation of the linear amplifier 109 during normal operation and to supply a very small current during idle time. As for the control of the switch, the switch 201 is turned on normally and the switch 201 is turned off at the idle time.

According to the present embodiment, since there is no dummy circuit, a wider bandwidth and area reduction can be expected due to reduction of the parasitic capacitance of the output load in comparison with the second embodiment. On the other hand, although the drive current is small, since the transistors 205a, 205b, 206a, and 206b are operating even during idle time, there is a possibility of amplifying small noise that has been input into the cable module to output the amplified noise. Accordingly, a CTLE amplifier (not illustrated) that is turned off at the idle time may be disposed between the detector 106 and the linear amplifier 109 to enhance the isolation between input and output at the idle time.

Sixth Embodiment

Figure 7:
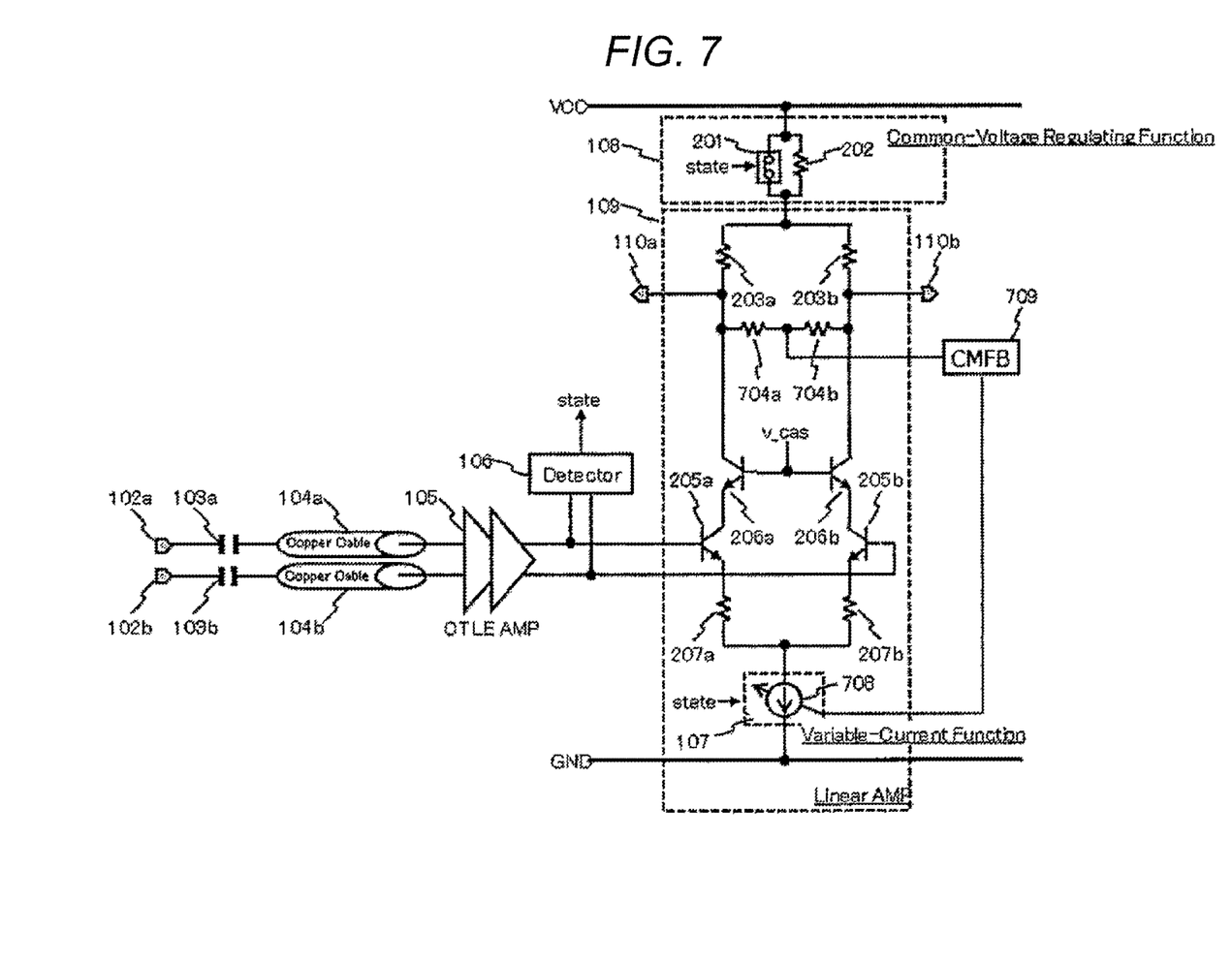
FIG. 7 is a configuration diagram for illustrating a sixth embodiment of the communication cable module according to the present invention.

The sixth embodiment of the present invention will be described with reference to FIG. 7. The communication cable module shown in FIG. 7 is an ACC and is the same as that of the fifth embodiment, except that the resistors 704a and 704b, and a common-mode feedback circuit 709 are added.

The resistors 704a and 704b for extracting the common-mode voltage are connected to points between the load resistors 203a and 203b and the cascode transistors 206a and 206b respectively. The output common-mode voltage at the midpoint of the resistors 704a and 704b is input into the common-mode feedback circuit 709 to be compared with the designed common-mode voltage, which is not illustrated. When the output common-mode voltage has a difference from the common-mode voltage, the common-mode feedback circuit 709 controls a variable current source 708 such that the above difference is eliminated.

Therefore, according to the present embodiment, since the common-mode feedback circuit provides feedback so as to keep the output common-mode voltage constant, the sensitivity of the output common mode voltage with respect to the temperature and the fluctuation of the power supply voltage can be reduced as compared with the fifth embodiment.

The present invention is not limited to the embodiments described above, and thus includes various variations. For example, part of a configuration of an embodiment can be replaced with a configuration of another embodiment, and a configuration of an embodiment can also be added to a configuration of another embodiment. In addition, it is possible to perform addition, deletion, or replacement of a configuration of one embodiment with respect to a part of the configuration of each of other embodiments.

What is claimed is:

1. A communication cable module comprising:
a conductive cable;
a linear amplifier connected to the conductive cable;
a detector for detecting presence or absence of an input signal of the conductive cable;
a first circuit having a variable-current function; and
a second circuit having a common-mode voltage regulating function, wherein
when the input signal is not present, the variable-current function of the first circuit reduces an output current of the linear amplifier and the common-mode voltage regulating function of the second circuit regulates an output common-mode voltage of the linear amplifier.

2. The communication cable module according to claim 1, wherein
the first circuit includes a dummy amplifier circuit that replaces at least a part of a circuit of the linear amplifier when the input signal is not present.

3. The communication cable module according to claim 1, wherein
the second circuit is inserted between the linear amplifier and a predetermined potential, and includes a load resistor and a switch connected with each other in parallel.

4. The communication cable module according to claim 1, wherein
the second circuit is inserted between the linear amplifier and a predetermined potential, and includes a switch with a large on-resistance and a switch with a small on-resistance connected with each other in parallel.

5. The communication cable module according to claim 1, wherein
the second circuit includes a regulator circuit capable of changing a voltage supplied to the linear amplifier.

6. The communication cable module according to claim 1, wherein
the first circuit includes a variable current source that changes a current value of a current source of the linear amplifier.

7. The communication cable module according to claim 6, further comprising:
a common-mode feedback circuit to provide feedback of a difference between a reference voltage and the output common-mode voltage to the variable current source so that the output common-mode voltage of the linear amplifier is constant.

8. A transmission loss compensation circuit that compensates a transmission loss of a conductive cable, the transmission loss compensation circuit comprising:
a linear amplifier connected to the conductive cable;
a detector for detecting a state of an input signal of the conductive cable;
a first circuit having a function of varying a current of the linear amplifier; and
a second circuit having a function of regulating a common-mode voltage of the linear amplifier, wherein
the transmission loss compensation circuit changes an operation mode of the first circuit and the second circuit according to the state of the input signal detected by the detector.

9. The transmission loss compensation circuit according to claim 8, wherein
the mode can be switched between two modes which are a normal mode to be set when the detector detects the input signal and an idle mode to be set when the detector does not detect the input signal, and
in the normal mode, the first circuit supplies a first current to the linear amplifier and the second circuit controls to set the common-mode voltage of the linear amplifier to a first potential, and
in the idle mode, the first circuit supplies a second current smaller than the first current to the linear amplifier and the second circuit controls to set the common-mode voltage of the linear amplifier to the first potential.

10. The transmission loss compensation circuit according to claim 9, wherein
the first circuit is a circuit for switching between a first current source for supplying the first current and a second current source for supplying the second current.

11. The transmission loss compensation circuit according to claim 10, further comprising:
a dummy amplifier circuit that replaces at least a part of a configuration of the linear amplifier, wherein
in the idle mode, the second current source supplies the second current to the dummy amplifier circuit and a dummy signal of a system different from a system of the input signal of the conductive cable is input into the dummy-amplifier circuit.

12. The transmission loss compensation circuit according to claim 9, wherein
the first circuit is a variable current source.

13. The transmission loss compensation circuit according to claim 12, further comprising:
a common-mode feedback circuit that provides feedback to the variable current source so that the output common-mode voltage of the linear amplifier is constant.

14. The transmission loss compensation circuit according to claim 9, wherein
the linear amplifier is disposed between the first potential and a second potential, and
the second circuit is a circuit disposed between the first potential and the linear amplifier to switch a resistance value between the first potential and the linear amplifier, and
the second circuit makes the resistance value between the first potential and the linear amplifier greater in the idle mode than in the normal mode.

15. The transmission loss compensation circuit according to claim 9, wherein
the linear amplifier is disposed between the first potential and a second potential,
the second circuit is a regulator circuit disposed between the first potential and the linear amplifier, and
the regulator circuit controls a voltage supplied to the linear amplifier.

* * * * *